United States Patent
Longwell et al.

(10) Patent No.: US 6,560,725 B1
(45) Date of Patent: May 6, 2003

(54) METHOD FOR APPARATUS FOR TRACKING ERRORS IN A MEMORY SYSTEM

(75) Inventors: Michael L. Longwell, Austin, TX (US); William Daune Atwell, Spicewood, TX (US); Jeffrey Van Myers, Driftwood, TX (US)

(73) Assignee: Madrone Solutions, Inc., Austin, TX (US)

( * ) Notice: Subject to any disclaimer, the term of this patent is extended or adjusted under 35 U.S.C. 154(b) by 0 days.

(21) Appl. No.: 09/335,992

(22) Filed: Jun. 18, 1999

(51) Int. Cl.[7] ................................................ G06F 11/00
(52) U.S. Cl. ...................... 714/54; 714/48; 714/704; 714/718; 714/763; 714/764; 711/105; 711/106
(58) Field of Search .................. 714/54, 704, 764, 714/763, 753, 752, 719, 718, 57, 48, 52; 711/104, 105, 106

(56) References Cited

U.S. PATENT DOCUMENTS

| | | | | |
|---|---|---|---|---|
| 4,209,846 A | * | 6/1980 | Seppa | 714/52 |
| 4,319,356 A | * | 3/1982 | Kocol et al. | 714/54 |
| 4,371,930 A | * | 2/1983 | Kim | 174/54 |
| 4,506,362 A | * | 3/1985 | Morley | 714/6 |
| 4,694,454 A | * | 9/1987 | Matsuura | 365/22 |
| 4,958,352 A | * | 9/1990 | Noguchi et al. | 714/704 |
| 4,964,130 A | * | 10/1990 | Bowden et al. | 714/704 |
| 5,233,614 A | * | 8/1993 | Singh | 714/702 |
| 5,890,198 A | * | 3/1999 | Pawlowski | 365/222 |

* cited by examiner

Primary Examiner—Robert Beausoliel
Assistant Examiner—Yolanda L. Wilson
(74) Attorney, Agent, or Firm—Jeffrey Van Myers

(57) ABSTRACT

A method for tracking errors in a memory system by detecting an error in a bit of a word accessed in the memory and maintaining an error history comprising a record of each of the detected errors. The error history information may be used to configure the memory, such as to add redundancy; or may be used to adjust operating parameters of the memory, such as the periodicity of refresh and/or scrub operations; or may be used to trigger a sensing operation of other parameters in an application system. In one embodiment, a counter increments each time an error is detected and decrements when no error is detected, thereby tracking error patterns.

19 Claims, 2 Drawing Sheets

METHOD FOR APPARATUS FOR TRACKING ERRORS IN A MEMORY SYSTEM

FIELD OF THE INVENTION

The present invention relates to integrated circuit dynamic memories, and more specifically to methods of tracking errors in a memory system having detection and correction of errors in a memory.

BACKGROUND OF THE INVENTION

Systems containing digital electronic components are designed to function correctly over a variety of system parameters and conditions, such as voltage, temperature, etc. System parameters such as bias voltages are typically adjusted by open loop control methods through the use of sensors, such as temperature sensing diodes, and voltage sensors. Similarly, sensors have been used to monitor conditions which initiate a sleep-mode or idle-mode operation. These methods prevent incorrect operation of or damage to many components, particularly memory devices. Many means have been developed to correct "hard" component failures and/or "soft" noise induced loss of data.

Various methods have been developed to detect and correct errors in memory. In a Dynamic Random Access Memory (DRAM) redundant columns and rows are added to avoid the use of memory cells exhibiting poor performance. An Error Detection And Correction unit (EDAC) is used to detect errors in stored data, and if possible, correct errors in the data. EDACs greatly improve data integrity. The operation of one type of EDAC is based on a code word. Data to be stored in the memory is provided to the EDAC. The EDAC then generates check bits based on the data value. The check bits are then combined with the data to form a code word. The code word is then stored in the memory. To check the data, the EDAC reads the code word from the memory and recalculates the check bits based on the data portion of the code word. The recalculated check bits are then compared to the check bits in the code word. If there is a match, the data is correct. If there is a difference and the error is correctable, the EDAC provides the correct data and check bits as an output. If there is a difference and the error is uncorrectable, the EDAC reports the occurrence of a catastrophic failure.

A variety of EDAC techniques and circuits are available, as are a variety of methods for generating code words and performing bit checks. Some methods are discussed in U.S. Pat. No. 5,598,422, by Longwell, et al., entitled "Digital computer having an error correction code (ECC) system with comparator integrated into re-encoder," and in *Error-Correction Codes,* by W. W. Peterson, 2d edition, MIT Press (1972). The information from the EDAC unit is typically used as it is generated. Information such as the address of data that has been corrupted, or the location of failed bits in data are not retained after an EDAC has returned correct data.

A need exists to obtain information over time regarding the errors experienced in the memory. There is a need to retain error address and error frequency information to improve hardware reliability and/or data integrity. There is further a need to analyze error information to determine a connection between such failures and parameters of the system.

BRIEF DESCRIPTION OF THE DRAWINGS

The present invention may be more fully understood by a description of certain preferred embodiments in conjunction with the attached drawings in which.

DETAILED DESCRIPTION OF THE PREFERRED EMBODIMENTS

Figure 1:
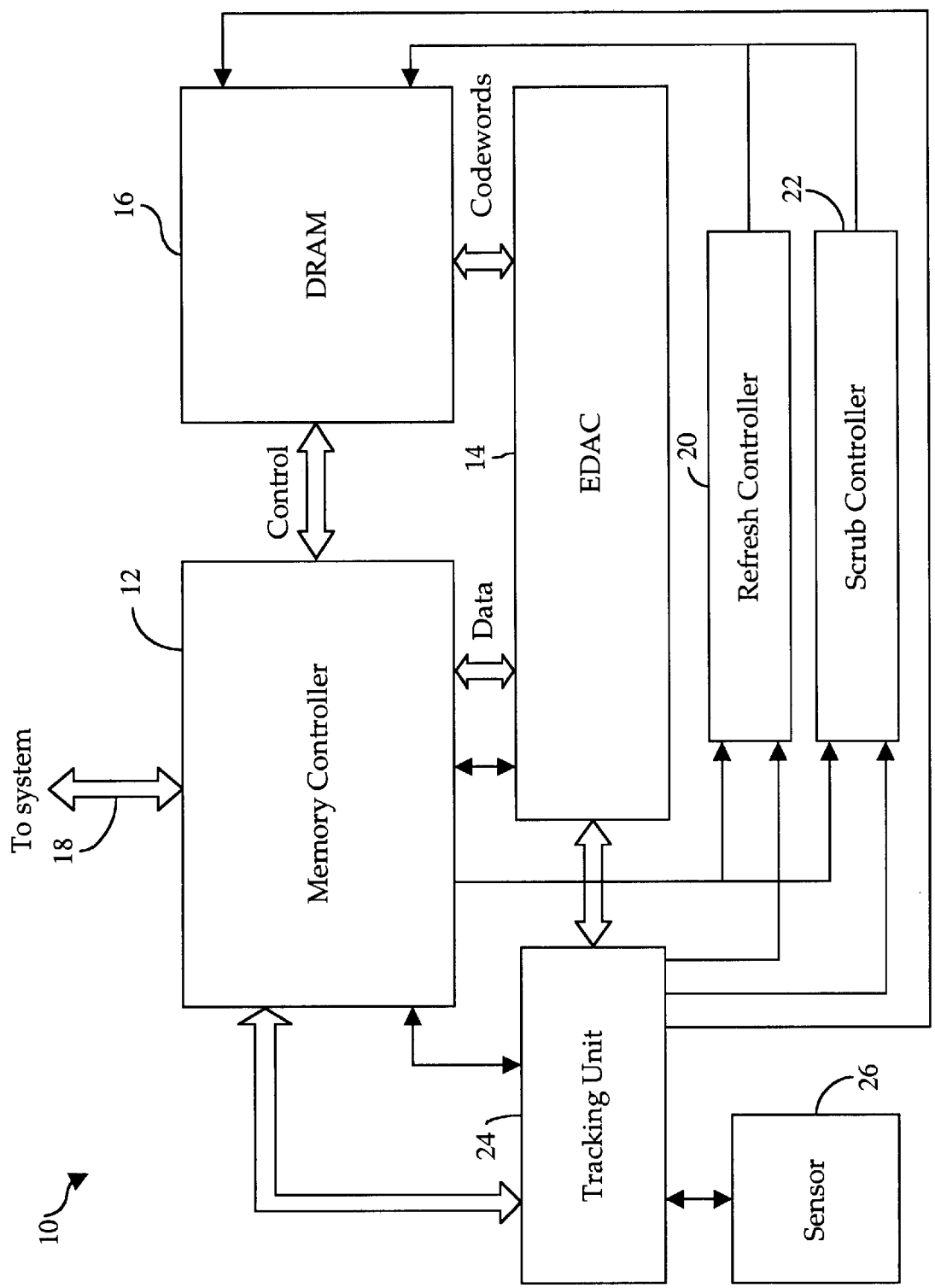
FIG. 1 illustrates in block diagram form a memory system having an error detection and correction (EDAC) unit and a tracking unit according to one embodiment of the present invention.

Throughout this description the terms "assert" and "negate" are used when referring to the rendering of a signal, signal flag, status bit, or similar apparatus into its logically true or logically false state, respectively. Similarly, with respect to information or data stored in a memory, a "zero" value is a low potential value, and a "one" is a high potential value.

The present invention extends the operating environment in which a memory can reliably store data by providing a means for tracking errors detected by an EDAC unit or other error detection and/or correction unit. This information may be employed advantageously to control the operating characteristics of other modules within the memory system. This allows the reuse of DRAM error information to adjust various operating parameters of the DRAM, such as access latency, the refresh cycle parameters, the scrub parameters, the voltage bias of the memory cells, and the like. Additionally, the present invention uses the DRAM error information to initiate sensing and measurement of other system parameters, such as temperature and supply voltage. Still further, the present invention provides a method of using the DRAM error information to adjust the memory configuration through means such as avoiding a defective memory location, and activating redundancy (e.g., redundant rows, columns, code words, or bits). The present invention effectively uses information from the EDAC, such as the address of data that has been corrupted, or the location of failed bits in data, for closed-loop control of system parameters to reduce the risk of catastrophic or non-recoverable system failure.

In one aspect of the present invention, in a memory system having a dynamic memory for storing a plurality of words, each comprising a plurality of bits, an error detection and tracking circuit includes an error detection circuit and a tracking unit. The error detection circuit is connected to the memory to detect an error in a bit of a word accessed in the memory. The tracking unit is connected to the error detection circuit to maintain an error history comprising a record of each of said detected errors.

In another embodiment, an error detection and tracking circuit for use in a memory system having a dynamic memory for storing a plurality of words, each comprising a plurality of bits, includes an error detection circuit connected to the memory to detect an error in a bit of a word accessed in the memory; and a tracking unit connected to the error detection circuit to maintain an error history comprising a record of each of said detected errors.

In still another aspect of the present invention, a method for tracking errors in a memory system having a dynamic memory for storing a plurality of words, each comprising a plurality of bits, includes the steps of detecting an error in a bit of a word accessed in the memory; and maintaining an error history comprising a record of each of said detected errors.

While the present invention is described with respect to a DRAM memory system, it is also applicable to other forms of memory, such as non-volatile memory and Static Random Access Memory (SRAM), or any other memory where reliability is desired at a higher level than that intrinsic to the technology.

Shown in FIG. 1, in block diagram form, is a memory system 10 constructed according to the preferred embodiment of our invention to reliably support a data processing system (not illustrated). The memory system 10 is generally comprised of a memory controller 12, an EDAC 14, and a DRAM 16. In operation, the memory controller 12 receives memory access requests from an external source (not shown), via a system bus 18.

For a write access, each request comprises both data and control information relating to that access, e.g., memory address, timing and sequencing control. Upon receiving a write access request, the memory controller 12 forwards the data to the EDAC 14. From that data, the EDAC 14 generates a code word for storage in the DRAM 16.

For a read access, each access request consists of the usual control information. Upon receipt of a read access request, the memory controller 12 instructs the DRAM 16 to provide the appropriate code word to the EDAC 14 for verification. If no errors are detected, or if a single-bit error is detected and corrected, the EDAC 14 provides the requested data to the memory controller 12 for forwarding to the requesting external source (not shown). If a multi-bit error is detected, however, the EDAC 14 signals the memory controller 12, and special procedures may be invoked.

Although we have illustrated the EDAC 14 as a single unit, it may be desirable in appropriate circumstances to provide multiple EDACs, such as in the distributed EDAC system we described in our co-pending U.S. patent application Ser. No. 09/334,238 entitled "Method and Apparatus for Error Detection and Correction," by Longwell, et al., filed on Jun. 16, 1999, and assigned to the assignee hereof (the "'009 Application"). To facilitate our description of the present invention, we hereby expressly incorporate herein our '009 Application by reference.

In the preferred embodiment shown in FIG. 1, a refresh controller 20 is provided to periodically refresh the DRAM 16, in coordination with normal read and write accesses controlled by the memory controller 12. To facilitate early detection and correction of errors which might occur in the DRAM 16, a scrub controller 22 is also provided to cooperate with the refresh controller 20 and the memory controller 12 to periodically scrub the DRAM 16. We have described the construction and operation of such a scrub controller 22 in our now abandoned U.S. patent application Ser. No. 09/313,876, entitled "Method and Apparatus for Refreshing and Scrubbing a Dynamic Memory," by Longwell, et al., filed on May 18, 1999, and assigned to the assignee hereof (the "'008 Application"). To facilitate our description of the present invention, we hereby expressly incorporate herein our '008 Application by reference.

In accordance with the preferred embodiment of our invention shown in FIG. 1, the memory system 10 includes a tracking unit 24 which monitors or tracks the error information obtained during each read access and scrub cycle, and makes decisions based on this error history. As illustrated in FIG. 1, the tracking unit 24 is coupled to the EDAC 14, the DRAM 16, the refresh controller 20, and the scrub controller 22. During operation of the memory system 10, the EDAC 14 provides to the tracking unit 24 status information reflecting the quality of all code words retrieved from the DRAM 16 during either a read access or a scrub cycle. For example, if an error is detected during a particular read access, the EDAC 14 may forward to the tracking unit 24 the address in the DRAM 16 of the code word in error, as well as the nature of that error, e.g., single-bit or multi-bit. In the case of a single-bit error, the EDAC 14 may also provide the bit location in the code word at which the error occurred. On the other hand, if no error is detected, the EDAC 14 may provide information so indicating. In a distributed EDAC system, such as in our '009 Application, the status information provided by the EDACs may be combined together and provided simultaneously to the tracking unit 24, or may be time multiplexed over the same conductors, or may be provided over separate conductors from each EDAC.

In general, the tracking unit 24 monitors the error information received from the EDAC 14, and maintains a historical record which facilitates early identification of trends. In our preferred embodiment, the tracking unit 24 is coupled to the memory controller 12, and can assert corresponding flags upon detecting certain predetermined memory conditions associated with memory errors. Such predetermined memory conditions generally fall into three categories: memory configuration, memory operation, and system configuration.

In accordance with our invention, it is irrelevant which particular unit is assigned the task of making control decisions in response to the historical error information maintained by the tracking unit 24. For example, either the memory controller 12, the tracking unit 24, or the system processor (not shown), may be appropriate in particular instantiations. Accordingly, for purposes of this description, we will assume that the tracking unit 24 is the designated decision maker, and is provided with an appropriately-programmed state machine (see, e.g., FIG. 2).

One convenient way to maintain the error information so that is stays "fresh" is to implement the history file as a "leaky bucket" wherein, periodically, the oldest individual record is automatically discarded. On the other hand, in many instantiations, a simple first-in, first-out circular queue of records will suffice. We prefer a combination of the two. In addition, we recommend providing any of several known mechanisms for selectively forwarding the error records to the external system (not shown) for longer-term storage. Performance monitoring system software (not shown) will then be able to provide a more in-depth analysis of the performance of the memory system 10.

Now, with respect to memory configuration, the tracking unit 24 may focus on those locations in the DRAM 16 associated with repeating errors, to determine if the number of errors in a particular memory location during a relevant time duration has exceeded a selected threshold, indicating that this bit should be treated as a hard error. In this case, the tracking unit 24 may decide not to use the questionable location for data storage. In a suitably configured memory system 10, the tracking unit 24 may selectively enable a redundant storage element in the DRAM 16, such as a redundant column, row, or bit. Such redundant structures, and their methods of enablement and operation, are well known to practitioners in the field of DRAMs.

With respect to memory operation, the tracking unit 24 may identify gradually degrading memory performance, such as might be due to operation in an environment of elevated temperature, poor voltage regulation, higher-than-normal alpha particle hit rates, and the like. Under such conditions, errors may not necessarily exhibit localized error patterns, but may simply occur more frequently. Our experience indicates that such errors often tend to be isolated to some "weak" portion of the DRAM 16, but they may also be distributed more or less randomly throughout a well-balanced DRAM 16. In such cases, the tracking unit 24 may instruct the refresh controller 20 and/or the scrub controller 22 to adjust their cycles accordingly.

For example, if errors appear to be increasing in frequency, it may be desirable to increase the frequency of scrub cycles to reduce the cumulative opportunity for catastrophic multiple soft errors. Similarly, it may be decided to increase the frequency of the refresh cycles. Or it may be desirable to use a "refresh with scrub cycle" such as we have described in our '008 Application.

In some commercially-available systems, the memory system 10 is implemented with a deregulated power supply. Such deregulation is often used intentionally to adhere to Federal Communication Commission requirements regarding noise signal transmissions. On the other hand, a deregulated power supply may adversely effect the DRAM 16. In such an instantiation, the error history maintained by the tracking unit 24 may indicate, for example, the need to refresh or scrub the DRAM 16 more often.

In accordance with our invention, the timing parameters and maintenance conditions of the DRAM 16 may also be adjusted to accommodate adverse operating conditions, such as temperature variations and changes in voltage bias. In each case, the relevant environmental condition may adversely affect the operation of the memory. One action taken to compensate for degraded performance of the DRAM 16 vis-à-vis error rate, for example, would be the insertion into each access cycle of one or more extra wait states. Should the operating conditions thereafter improve, the number of extra wait states can be reduced. In a memory system 10 which has been conservatively specified to insert one or more wait states, it may be possible, using our invention, to determine that operating conditions are, in fact, better than predicted at system design time, so that the number of such specified wait states can be reduced. Similarly, access cycle timing, refresh frequency, and scrub cycle scheduling can all be adjusted to compensate for the actual performance of the DRAM 16, whether such performance is better or worse than expected.

It is common practice for semiconductor manufacturers to offer a limited range of products, such as DRAMs, each having a respective guaranteed set of performance specifications related to stated operating conditions. However, it is also well known that often, due to normal process variation, a particular integrated circuit will, in fact, perform substantially better than specified, even under the exact operating conditions set forth in the respective specification, including temperature and voltage. In accordance with our invention, such latent performance can be recognized and exploited by appropriate adjustments to the several operating parameters until error rates begins to suffer, and then backing off to return the error rate to the desired level.

With respect to system configuration, changes in the performance of the DRAM 16 over time, and compensative actions taken to address adverse changes, may necessitate changing certain operating parameters or characteristics of the system within which the memory system 10 is operating. In this case, memory performance information may provide warning signals to the processor of potential problems in sufficient time to allow corrective actions to be taken before serious degradation in performance occurs. In the event that the memory system 10 takes remedial action which would be visible to the system, such as inserted wait states, more frequent refresh/scrub cycles, or stretched access cycle timing, other system components must adapt accordingly. In some circumstances, the system may elect to enter a low-power mode or otherwise reduce its demands upon the memory system 10. In severe cases, the system may even decide to disable the entire memory system 10, or a selected portion thereof, until the underlying problem can be resolved. For example, the system may instruct the memory system 10 to put a portion of the DRAM 16 into a low-power or "sleep mode", as described in our co-pending U.S. patent application Ser. No. 09/303,284, entitled "Method for Operating an Integrated Circuit having a Sleep Mode," by Longwell, et al., filed on Apr. 30, 1999, and assigned to the assignee hereof (the "'006 Application"). To facilitate our description of the present invention, we hereby expressly incorporate herein our '006 Application by reference. The system processor (not shown) may also initiate further checks throughout the system in an effort to determine the root cause. In accordance with our invention, the historical error information maintained by the tracking unit 24 will greatly facilitate early identification of system problems.

In one embodiment, the tracking unit 24 may selectively activate a special circuit to assist in the analysis of the problem. For example, as shown in FIG. 1, a sensor 26 is frequently incorporated into an integrated circuit to facilitate testing of relevant operating parameters, such as temperature, bias voltage, etc. Typically, these devices are always "on", continuously consuming operating power and generating excess heat. Sometimes, they are selectively enabled by system software (not shown) when an operating problem is suspected. In accordance with our invention, the tracking unit 24 can automatically enable the support sensor 26 so as to limit its operation to only those situations in which (and only so long as) the information it provides appears to be pertinent to selecting the most appropriate, alternate action to resolve a specific, detected error scenario. Of course, a suite of such sensors of the various known types may be provided to improve the ability of the tracking unit 24 to efficiently identify and isolate, if possible, the basic cause of the increased error rate so that the optimum response may be implemented in a timely fashion.

Figure 2:
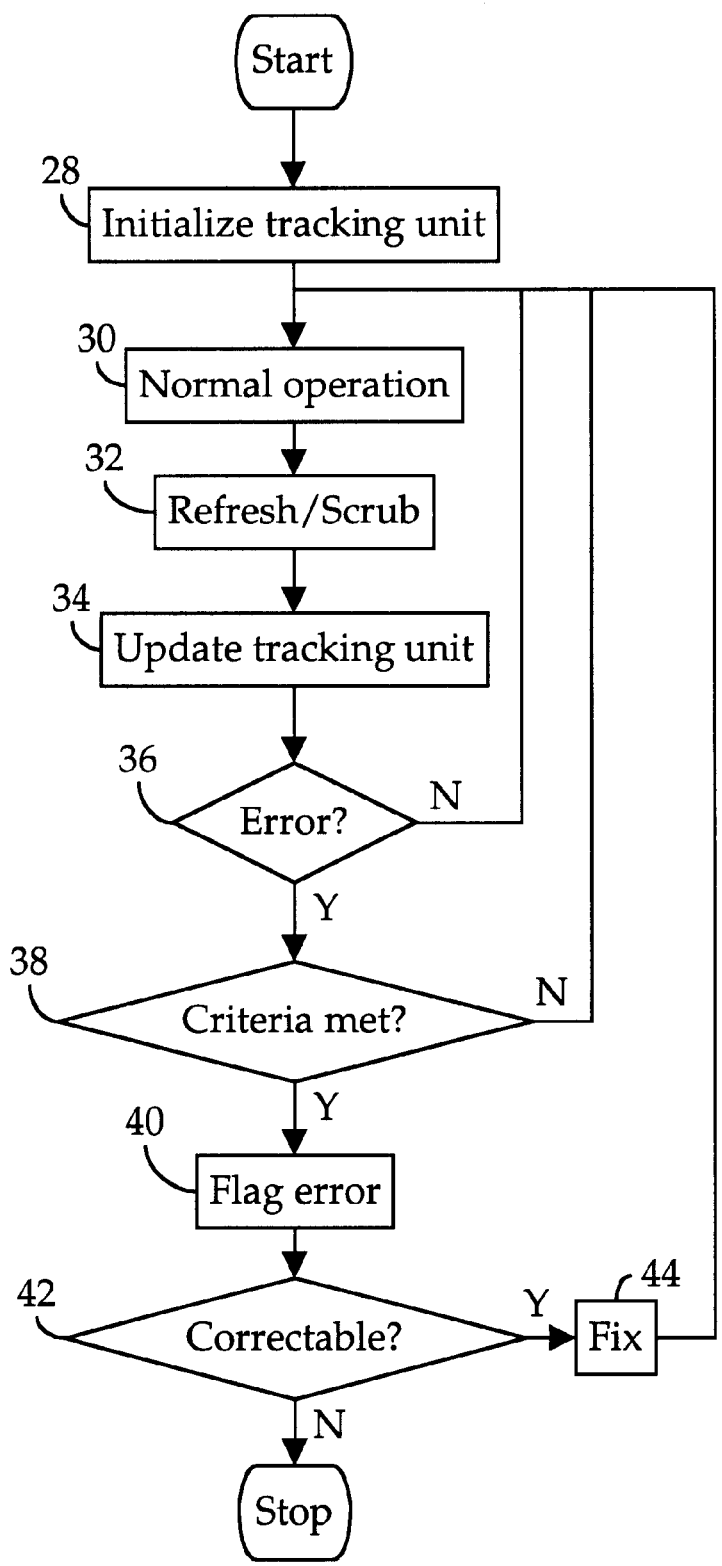
FIG. 2 illustrates in flow diagram form a method for tracking errors in a memory system having an EDAC unit according to one embodiment of the present invention.

Shown in FIG. 2 is our preferred method of tracking errors in a memory system constructed in accordance with the preferred embodiment of our invention shown in FIG. 1. Although this method can be easily expanded to track errors detected in the course of normal read accesses, we have found the most natural tracking time interval for detecting error trends is a "scrub sequence", that is, the time period required to scrub all locations in the DRAM 16 once. Applying this method to the memory system 10, a data structure (not shown) in the tracking unit 24 is initialized (28) prior to the DRAM 16 entering a normal operating mode (30). At a predetermined time thereafter, the memory system 10 performs a scrub operation (32). The data structure in the tracking unit 24 is then updated to reflect the status of the access (34). If no error was detected (36), the memory system 10 returns to normal operation (30). If an error was detected (36) but a predetermined criteria has not been satisfied (38), the memory system 10 also returns to normal operation (30). If the criteria has been met, the tracking unit 24 will assert an error flag (40) to advise all interested components, such as the memory controller 12, the DRAM 16 or the external processor (not shown), of the error event. If the error scenario is one which the tracking unit 24 is capable of correcting (42), the tracking unit 24 implements the appropriate fix (44), and the memory system 10 returns to normal operation (30).

In one embodiment, when the tracking unit 24 is updated (34), a high-order portion of an error counter maintained in the data structure in the tracking unit 24 is incremented each time an error is detected during a scrub cycle. In contrast, each time a scrub cycle detects no error in the scrubbed code word the tracking unit 24 decrements the entire error counter. When this error counter exceeds a predetermined threshold value, too many errors have occurred within a current "tracking window". In general, the effect of each error has been "spread" over a wider window by incrementing the high-order portion of the error counter but decrementing the full error counter.

Another relevant criteria may be the total errors since the last initialization event. Indeed, there may be several criteria, e.g., one for each of several error classes, such as single-bit errors, double-bit errors, etc. If any one of the criteria is met the tracking unit 24 flags the error (40). Flagging the error may involve notifying the memory controller 12 that a decision criteria is satisfied, or may involve taking a specific action, such as initiating a sensing operation. In one embodiment, the tracking unit 24 provides specific locational information to the memory controller 12. Note that the specific action to be taken may be determined heuristically by software (e.g., an expert system) or hardware (e.g., fuzzy logic) in the tracking unit 24 and/or the memory controller 12.

The tracking unit 24 may also determine where to provide the information. For example, as illustrated in FIG. 1, the tracking unit 24 communicates directly with the refresh controller 20 and may decide to increase the frequency of refresh cycles. Similarly, based on the error history, the tracking unit 24 may decide to initiate more scrub cycles per unit time, or combine refresh and scrub cycles, or alter the refresh and/or scrub operation to improve the performance of the memory. Note that the tracking unit 24 may also identify good performance and adjust the system parameters to reduce the power consumption of the memory system or increase the time available for normal operation and thus increase the system performance of the memory.

An unusually rapid accumulation of errors may suggest the desirability of monitoring other system parameters, including junction temperature, leakage current, supply potential variations, and the like. Similarly, the error history may suggest the desirability of adjusting various reference voltages within the DRAM 16, such as those associated with capacitor plate voltage, boosted word line voltage, and substrate bias.

Where the error history provides feedback-information for control of the refresh operation, the refresh period may be adjusted to reduce error rates. The feedback information may be limited to the duration between each refresh cycle, or may be cumulative. The advantage of such feedback method is the direct correlation between deteriorating data integrity and the corrective action, as contrasted with the prior method of using temperature or voltage sensors to indirectly infer loss of integrity.

In one other embodiment, the access time for the memory device may be adjusted as a function of the error history. The ability to adjust this timing adds flexibility to DRAM design, allowing the memory to perform over a broader range of operating conditions and in a broad range of environments. Unlike conventional DRAM devices, for which operating environment and conditions are specified, the present invention allows the DRAM to, in effect, dynamically adapt to its surroundings.

According to the present invention, detected errors are tracked or accumulated and information gleaned from the tracked errors. This information allows adjustment of memory parameters and system parameters. Similarly, measurements of parameters, such as voltage or temperature, whether initiated by the tracking unit 24, other means, or always operational, may be used in an open loop fashion to adjust memory parameters or system parameters.

In another embodiment, multiple tracking units or error accumulators may be provided to monitor across-chip parameter variation, providing a finer granularity of information. Individual portions of memory or memory tiles may be handled distinctly. By intentionally biasing a DRAM bit circuit to fail first (i.e., before other bits fail), the memory system may anticipate more widescale problems prior to occurrence.

While the present method has been described in the context of a scrub operation, the tracking may be done as an independent operation. Ideally, the tracking will not impact the operating speed of the DRAM device. Similarly, the error history may be evaluated each scrub cycle, or may be evaluated over an integral number of scrub cycles.

Thus it is apparent that there has been provided, in accordance with the present invention, a method for tracking errors in a memory system, and providing corrective action accordingly. Those skilled in the art will recognize that modifications and variations can be made without departing from the spirit of the invention. Therefore, it is intended that this invention encompass all such variations and modifications as fall within the scope of the appended claims.

What we claim is:

1. In a memory system having a memory for storing a plurality of words, each comprising a plurality of bits, an error detection and tracking circuit comprising:
   an error detection circuit connected to the memory to detect an error in a bit of a word accessed in the memory; and
   a tracking unit connected to the error detection circuit, wherein the tracking unit:
      maintains an error history comprising:
         a record of each word accessed in said memory in which an error is detected; and
         a record of each word accessed in said memory in which no error is detected; and
      periodically discards the oldest of said records in said error history.

2. The memory system of claim 1 wherein the error detection circuit corrects detected single-bit errors.

3. The memory system of claim 2 wherein the error detection circuit detects multi-bit errors.

4. The memory system of claim 1 wherein the tracking unit periodically discards the oldest of said records so that the error history comprises the records of only those detected errors recorded during a current tracking window.

5. The memory system of claim 4 wherein the tracking unit asserts an error signal when the number of errors recorded in the current tracking window exceeds a predetermined threshold.

6. The memory system of claim 1 wherein said record includes the location in the memory of the word in which said error bit was detected.

7. The memory system of claim 6 wherein said record indicates the nature of said error.

8. The memory system of claim 1 wherein the tracking unit selectively forwards said records in said error history.

9. The memory system of claim 1 further comprising:
   a refresh controller connected to the memory to periodically refresh each word stored in the memory; and
wherein the tracking unit controls the refresh periodicity as a function of the error history.

10. The memory system of claim 1 further comprising:
   a scrub controller connected to the memory to periodically scrub each word stored in the memory; and
   wherein the tracking unit controls the scrub periodicity as a function of the error history.

11. An error detection and tracking circuit for use in a memory system having a memory for storing a plurality of words, each comprising a plurality of bits, said memory further comprising a selectively enabled redundant bit, the circuit comprising:
   an error detection circuit connected to the memory to detect an error in a bit of a word accessed in the memory;
   a tracking unit connected to the error detection circuit, wherein the tracking unit maintains an error history comprising a record of each said detected errors; and
   a control circuit connected to the tracking unit and to the memory, to control the operation of said memory as a function of said error history; and
   wherein the control circuit selectively enables said redundant bit as a function of the error history.

12. An error detection and tracking circuit for use in a memory system having a memory for storing a plurality of words, each comprising a plurality of bits, said memory further comprising a selectively enabled sensor, the circuit comprising:
   an error detection circuit connected to the memory to detect an error in a bit of a word accessed in the memory;
   a tracking unit connected to the error detection circuit, wherein the tracking unit maintains an error history comprising a record of each said detected errors; and
   a control circuit connected to the tracking unit and to the memory, to control the operation of said memory as a function of said error history; and
   wherein the control circuit selectively enables said sensor as a function of the error history.

13. An error detection and tracking circuit for use in a memory system having a memory for storing a plurality of words, each comprising a plurality of bits, the circuit comprising:
   an error detection circuit connected to the memory to detect an error in a bit of a word accessed in the memory;
   a tracking unit connected to the error detection circuit, wherein the tracking unit maintains an error history comprising a record of each said detected errors;
   a memory controller connected to the memory, the error detection circuit and the tracking unit, to control an access to the memory during an access cycle, at least one parameter of which is controllable; and
   a control circuit connected to the tracking unit and to the memory controller, to control the operation of said memory controller as a function of said error history; and
   wherein the control circuit controls said parameter as a function of the error history.

14. An error detection and tracking circuit for use in a memory system having a memory for storing a plurality of words, each comprising a plurality of bits, the circuit comprising:
   an error detection circuit connected to the memory to detect an error in a bit of a word accessed in the memory;
   a tracking unit connected to the error detection circuit, wherein the tracking unit maintains an error history comprising a record of each said detected errors; and
   a control circuit connected to the tracking unit and to the memory, to control the operation of said memory as a function of said error history; and
   wherein the control circuit selectively disables a selected portion of the memory as a function of the error history.

15. A method for tracking errors in a memory system having a memory for storing a plurality of words, each comprising a plurality of bits, the method comprising the steps of:
   detecting an error in a bit of a word accessed in the memory;
   maintaining an error history comprising a record of each of said detected errors; and
   selectively enabling a redundant bit in the memory as a function of the error history.

16. A method for tracking errors in a memory system having a memory for storing a plurality of words, each comprising a plurality of bits, the method comprising the steps of:
   detecting an error in a bit of a word accessed in the memory;
   maintaining an error history comprising a record of each of said detected errors; and
   selectively controlling a parameter of an access cycle to the memory as a function of the error history.

17. A method for tracking errors in a memory system having a memory for storing a plurality of words, each comprising a plurality of bits, the method comprising the steps of:
   detecting an error in a bit of a word accessed in the memory;
   maintaining an error history comprising a record of each of said detected errors; and
   selectively disabling a selected portion of the memory as a function of the error history.

18. A method for tracking errors in a memory system having a memory for storing a plurality of words, each comprising a plurality of bits, the method comprising the steps of:
   detecting an error in a bit of a word accessed in the memory;
   maintaining an error history comprising a record of each of said detected errors; and
   selectively enabling a sensor as a function of the error history.

19. A method for tracking errors in a memory system having a memory for storing a plurality of words, each comprising a plurality of bits, the method comprising the steps of:
   detecting an error in a bit of a word accessed in the memory;
   maintaining an error history comprising a record of each of said detected errors;
   controlling the operation of said memory as a function of said error history; and
   periodically discarding the oldest of said records so that the error history comprises the records of only those detected errors recorded during a current tracking window.

* * * * *